(12) United States Patent
Sugino et al.

(10) Patent No.: US 8,405,178 B2
(45) Date of Patent: Mar. 26, 2013

(54) SOLID-STATE IMAGE SENSOR DEVICE

(75) Inventors: Shinya Sugino, Ome (JP); Satoshi Sakai, Yokohama (JP); Yusuke Nonaka, Tachikawa (JP); Tomohiro Saito, Tachikawa (JP); Tomoyasu Furukawa, Ome (JP); Hiroyuki Hayashi, Ome (JP)

(73) Assignee: Hitachi, Ltd., Tokyo (JP)

( * ) Notice: Subject to any disclaimer, the term of this patent is extended or adjusted under 35 U.S.C. 154(b) by 377 days.

(21) Appl. No.: 12/842,220

(22) Filed: Jul. 23, 2010

(65) Prior Publication Data

US 2011/0037134 A1  Feb. 17, 2011

(30) Foreign Application Priority Data

Aug. 17, 2009  (JP) ................... 2009-188189

(51) Int. Cl.
*H01L 23/48* (2006.01)
(52) U.S. Cl. .......... 257/432; 257/53; 257/292; 257/621; 257/758; 257/E31.127

(58) Field of Classification Search .................... 257/53, 257/292, 293, 432, 621, 758, E31.127
See application file for complete search history.

(56) References Cited

U.S. PATENT DOCUMENTS

| 6,734,906 | B1 | 5/2004 | Hashimoto |
| 7,154,549 | B2 | 12/2006 | Shizukuishi |
| 2012/0300102 | A1* | 11/2012 | Tamura et al. ............... 348/294 |

FOREIGN PATENT DOCUMENTS

| JP | 2000-78475 A | 3/2000 |
| JP | 2002-198508 A | 7/2002 |
| JP | 2003-249632 A | 9/2003 |

* cited by examiner

*Primary Examiner* — Jack Chen
(74) *Attorney, Agent, or Firm* — Crowell & Moring LLP

(57) ABSTRACT

In a solid-state image sensor device, the efficiency of light collection to a light-receiving region of a photodiode PD through a microlens is enhanced by arranging a wiring line configuration. Each of the first metal layer and the second metal layer is arranged to have a ring-like portion formed along a profile of the light-receiving region of the photodiode PD in a fashion that an upper position over the photodiode PD is surrounded by the first and second metal layers and a third metal layer.

12 Claims, 9 Drawing Sheets

SOLID-STATE IMAGE SENSOR DEVICE

CLAIM OF PRIORITY

The present application claims priority from Japanese patent application JP 2009-188189 filed on Aug. 17, 2009, the content of which is hereby incorporated by reference into this application.

FIELD OF THE INVENTION

The present invention relates to solid-state image sensor devices, and more particularly to a solid-state image sensor device having a plurality of metallic layers including a topmost light-shielding film.

BACKGROUND OF THE INVENTION

CMOS image sensors and CCD image sensors have been developed as solid-state image sensor devices that are incorporated in digital cameras, mobile-phone cameras, and the like. In the CMOS image sensor, MOSFET transistors are used for charge transfer from photoelectric conversion elements such as photodiodes (an insulated-gate field effect transistor is designated as MOSFET or MOS in the present specification). For reading out electric charge accumulated through photoelectric conversion, i.e., image information, it is required to perform independent-timing control for a multiplicity of MOSFET transistors included in the CMOS image sensor. Hence, it is common practice to form a plurality of layers for power supply lines and switching data lines in the CMOS image sensor (as disclosed in JP-A-2000-78475).

With an increase in the number of pixels, each pixel size has been reduced significantly, giving rise to the challenging design issue of how to enhance the efficiency of light collection. It is possible to enhance the efficiency of light collection by providing such an arrangement that incident light passing through a microlens is focused onto a photodiode. However, due to further integration density of pixels, there arises considerable difficulty in the optical design of the microlens. Where a focal length is increased, incident light is obstructed by a light-shielding film and/or a metal layer formed over the photodiode. Alternatively, where the focal length is decreased, incident light impinges on other parts than the photodiode. Thus, in the microlens optical design, it is difficult to achieve a satisfactory level of enhancement with respect to the efficiency of light collection.

As a solution to the above difficulty, a pixel structure using an optical waveguide has been devised. In this pixel structure, there is provided an optical waveguide for confinedly introducing incident light to a photodiode. When light is incident from a high-refractive-index material onto a low-refractive-index material, total reflection takes place depending on the angle of incidence thereof. Hence, in common practice of optical waveguide fabrication, a material having a refractive index higher than that of a dielectric layer surrounding an optical waveguide is formed on an interior wall of the optical waveguide or is embedded inside the optical waveguide. In fabrication of another type of optical waveguide, a cylindrical element having high-reflectivity metal coated on an interior wall thereof is employed.

In JP-A-2003-249632, there is disclosed an optical waveguide having a metallic film coated on an interior wall thereof. In this optical waveguide, an inlet thereof and a light-shielding film disposed as a topmost metallic layer are coupled to each other without gap, and a microlens is adjusted to have a focus position thereof in the vicinity of an open area of the light-shielding film so that light is securely incident into the optical waveguide and reflected by the metallic film coated on the interior wall to guidedly impinge on a photodiode.

In JP-A-2002-198508, there is disclosed a CCD type of solid-state image sensor device wherein transfer electrodes are configured in a single layer formed on the same plane via narrow gaps. The single layer is arranged with unnecessary space eliminated so as not to obstruct light incidence onto a photodiode, wiring lines thereof being disposed around the photodiode. A light-shielding film is made of nonconductive material, and a space available for wiring line arrangement is fully unitized to form a pixel part in a structure having merely one metal layer.

SUMMARY OF THE INVENTION

Though effective for enhancement of the efficiency of light collection, the above techniques using optical waveguides are disadvantageous in production cost and engineering applicability as mentioned below.

In general terms, the following procedure is to be taken for forming a metallic cylinder just over a photodiode, for example. First, a hole is formed in a dielectric layer disposed just over the photodiode by dry etching or the like. Then, a metallic film is formed on an interior wall and a bottom part of the hole by sputtering or chemical vapor deposition (CVD). Thereafter, a metallic film deposited on the bottom of the hole is removed by dry etching or the like. For metallic cylinder formation, it is required to add a series of these processes in device fabrication.

According to an aspect of the present invention, the efficiency of light collection can be enhanced by arranging the configuration of wiring lines formed in metal layers disposed over a photodiode. Since wiring lines for electrical signal propagation should be formed in any case regardless of whether or not an optical waveguide structure is provided, no substantial addition of process steps or production cost is incurred by modifying the configuration of wiring lines for implementation of the present invention. Further, in combination of the present invention with a conventional optical waveguide, it is possible to provide the advantageous effect of suppressing crosstalk due to incident light leakage.

According to one aspect of the present invention, a solid-state image sensor device includes: a photodiode; first and second wiring lines disposed at mutually adjacent positions in a first metal layer, each of the first and second wiring lines being arranged to extend in a first direction and to have a bowed portion bending along a profile of a light-receiving region of the photodiode; third and fourth wiring lines disposed at mutually adjacent positions in a second metal layer, each of the third and fourth wiring lines being arranged to extend in a second direction different from the first direction and to have a bowed portion bending along the profile of the light-receiving region of the photodiode; and a microlens; and the bowed portions of the first and second wiring lines are configured to surround the profile of the light-receiving region of the photodiode in the form of a ring, wherein the bowed portions of the third and fourth wiring lines are configured to surround the profile of the light-receiving region of the photodiode in the form of a ring, and light collected through the microlens is introduced to the light-receiving region of the photodiode by passage through the inside of the ring formed by the bowed portions of the first and second wiring lines and the inside of the ring formed by the bowed portions of the third and fourth wiring lines.

According to another aspect of the present invention, a solid-state image sensor device includes: a photodiode; a first wiring line disposed in a first metal layer, the first wiring line being arranged to extend in a first direction and to have a ring-formed portion with an open area thereof at a position corresponding to a light-receiving region of the photodiode; a second wiring line disposed in a second metal layer, the second wiring line being arranged to extend in a second direction different from the first direction and to have a ring-formed portion with an open area thereof at a position corresponding to the light-receiving region of the photodiode; and a microlens; and light collected through the microlens is introduced to the light-receiving region of the photodiode by passage through the open area of the ring-formed portion of the first wiring line and the open area of the ring-formed portion of the second wiring line.

In either of the above-mentioned aspects of the present invention, the efficiency of light collection can be enhanced by optimizing the configuration of the microlens and the thickness of a passivation layer so that the microlens has a focus position thereof at an open area of a topmost metal layer or the vicinity thereof.

As set forth hereinabove and according to the present invention, a satisfactory level of enhancement with respect to the efficiency of the light collection in the solid-state image sensor device can be achieved at low cost by configuring metallic ring forms using the metal layers stacked just over the photodiode.

DETAILED DESCRIPTION OF THE PREFERRED EMBODIMENTS

The present invention will now be described in detail by way of example with reference to the accompanying drawings.

Figure 2:
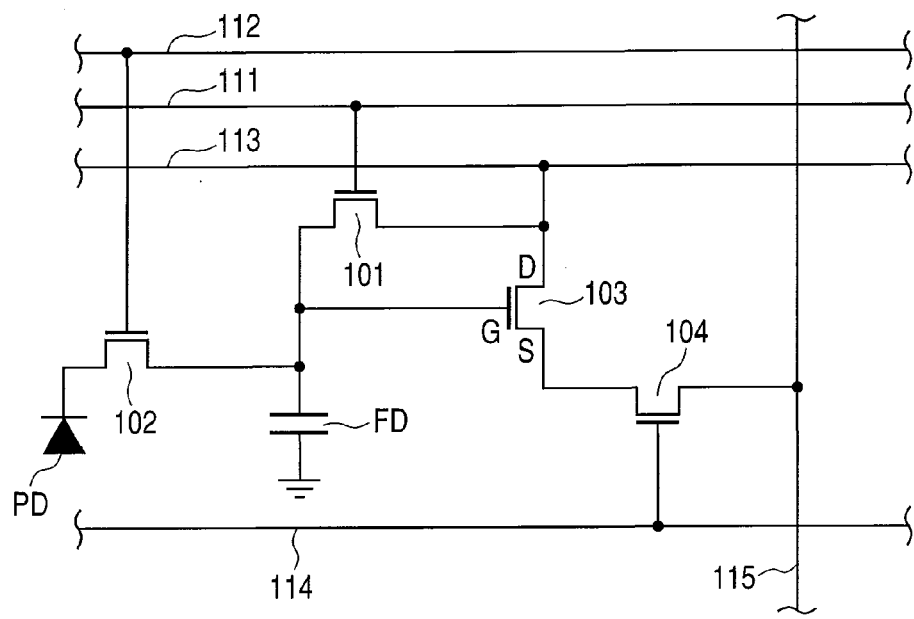
FIG. 2 is a circuit diagram of the CMOS image sensor (pixel)
Figure 3:
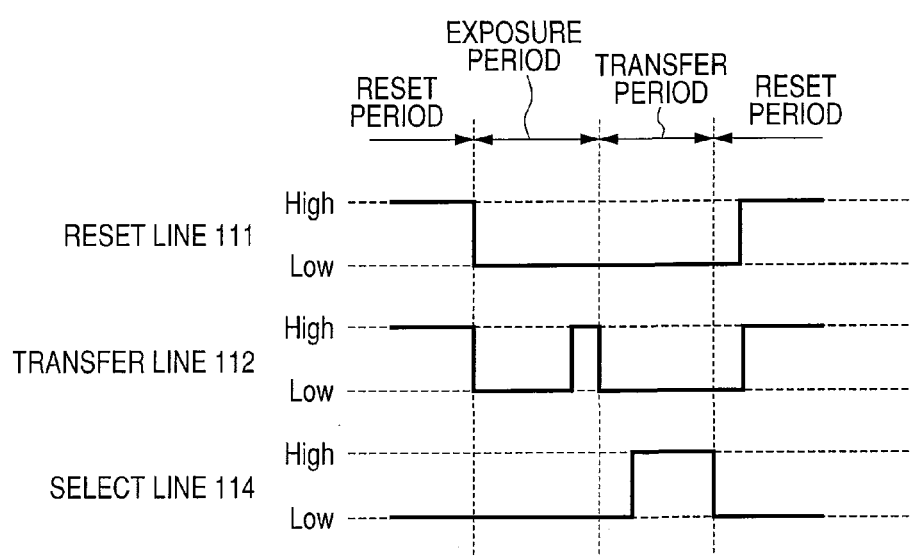
FIG. 3 is a timing chart showing circuit operations of the CMOS image sensor (pixel)

Referring to FIG. 2, there is shown a circuit diagram of a CMOS image sensor (pixel) according to a preferred embodiment of the present invention. It is to be noted that the circuit configuration shown in FIG. 2 is intended for illustrative purposes only and that the present invention is not limited thereto. With reference to a timing chart shown in FIG. 3, the following describes circuit operations of the CMOS image sensor (pixel).

For a reset period, a reset line 111 and a transfer line 112 are turned to a high state, causing a reset MOS transistor 101 and a transfer MOS transistor 102 to be brought into conduction. Thus, charge is taken out of each of a photodiode PD and a floating diffusion node FD. Thereafter, the reset line 111 goes low. For an exposure period, charge is accumulated in the photodiode PD due to irradiation with light. Then, the transfer line 112 goes high to put the transfer MOS transistor 102 into conduction. Thus, the charge accumulated in the photodiode PD is transferred to the floating diffusion node FD. Serving as a capacitor, the floating diffusion node FD accumulates charge corresponding to the amount of light irradiation to the photodiode PD. For a transfer period, a select line 114 goes high to put a select MOS transistor 104 into conduction. In an amp MOS transistor 103 coupled to a constant current supply, a constant current is fed between a source and drain thereof. Further, since the amp MOS transistor 103 has a gate electrode thereof coupled to the floating diffusion node FD, a gate voltage corresponding to the amount of charge accumulated therein is applied to the amp MOS transistor 103, i.e., a electric potential corresponding to the amount of charge accumulated appears at the source of the amp MOS transistor 103. The electric potential output thus attained is read out to a data line 115 via the select MOS transistor 104 as pixel information. Upon completion of reading out the pixel information, the reset MOS transistor 101 and the transfer MOS 102 are put into conduction again, thereby resetting charge accumulated in each of the photodiode PD and the floating diffusion node FD in preparation for the next cycle of exposure.

Figure 4:
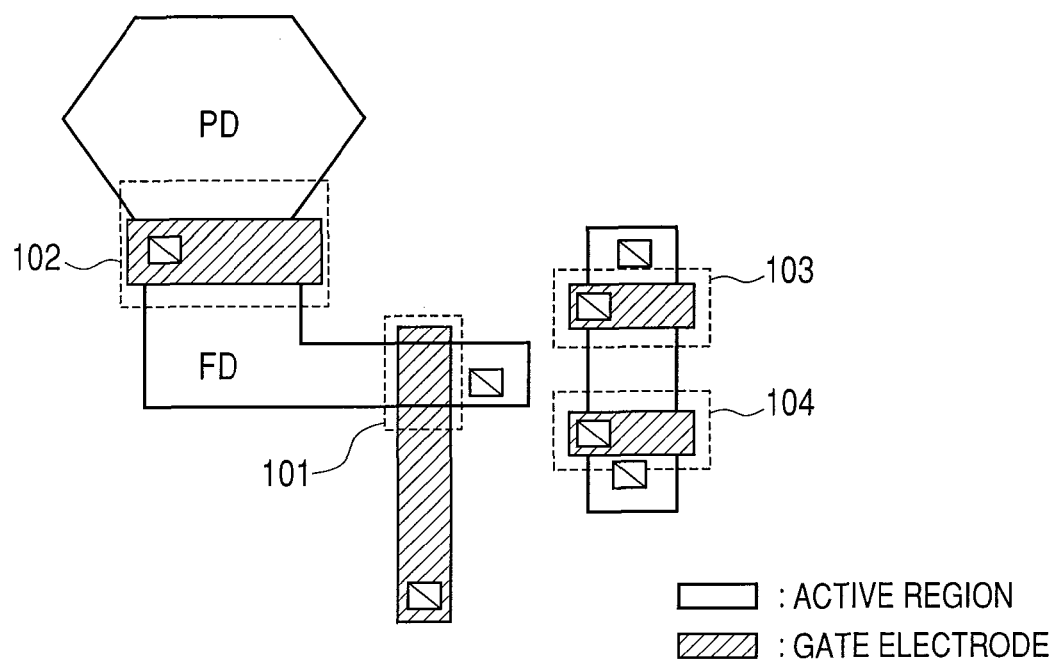
FIG. 4 is a diagram showing a diffusion layer layout of the CMOS image sensor (pixel)

An exemplary layout of the CMOS image sensor (pixel) shown in the circuit diagram of FIG. 2 is described below with reference to FIGS. 4 to 6. Although only one pixel part is taken for the sake of simplicity in description, it is to be understood that a multiplicity of pixels are provided in a repetitive pattern around each pixel shown in FIGS. 4 to 6. Referring to FIG. 4, there is shown a diffusion layer layout of the CMOS image sensor (pixel). In FIG. 4, each area enclosed by the solid lines is an active region formed in a well, and the other areas are isolation regions. In the active regions, gate electrodes are formed, and respective MOSFET transistors 101 to 104 are disposed (areas enclosed by the broken lines).

Figure 5:
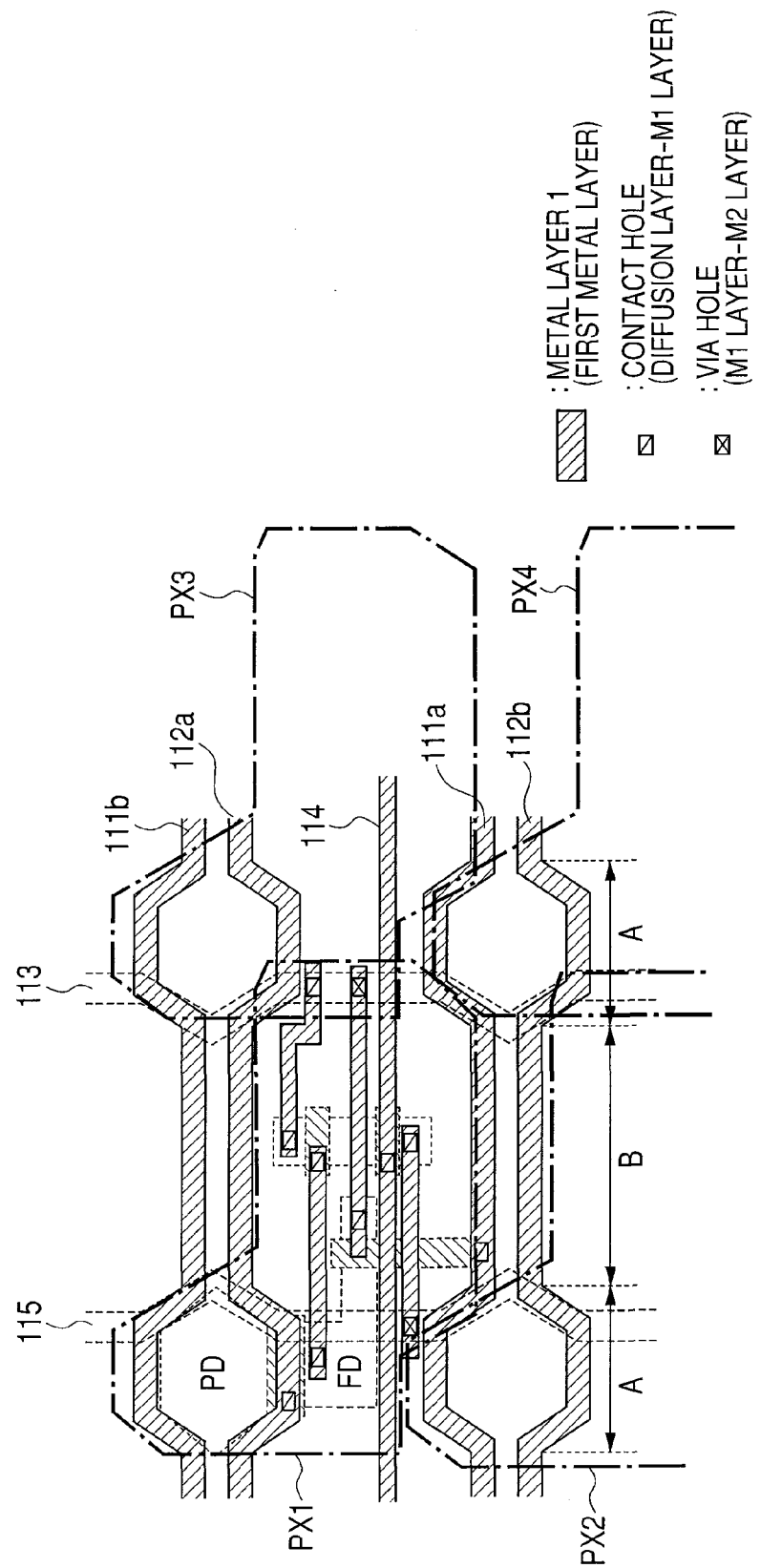
FIG. 5 is a diagram showing a first metal layer layout of the CMOS image sensor (pixel)

Referring to FIG. 5, there is shown an explanatory diagram of a first metal layer (M1 layer) of the CMOS image sensor (pixel). In FIG. 5, the diffusion layer and a second metal layer (M2 layer) are indicated by the dotted lines. Although pixels PX1 to PX4 (pixel formation parts indicated by the dot-dash lines) are disposed in a repetitive pattern, the layout of only the pixel PX1 is depicted in detail. A reset line 111a and a transfer line 112a are coupled to the pixel PX1. Each small square with an oblique line therein indicates a contact hole, which is used for coupling between the first metal layer and the diffusion layer (active regions, gate electrodes). Each small square with a cross mark therein indicates a via hole, which is used for coupling between the first metal layer and the second metal layer.

The layout shown in FIG. 5 has the following features: A wiring line laid out about a profile of a light-receiving region of the photodiode PD in the X direction (each of reset line 111 and transfer line 112 in the example demonstrated here) has a bowed portion A bending along the profile of the light-receiving region of the photodiode PD and a straight portion B extending in parallel with a corresponding straight portion of a wiring line adjacent thereto. Further, the portions B of mutually adjacent wiring lines (e.g., reset line 111a and transfer line 112b) are disposed to provide a line pitch as narrow as possible. That is, the mutually adjacent wiring lines are disposed with a minimum possible line pitch to the extent that the wiring capacity concerned will not cause an adverse effect on circuit operations.

Figure 6:
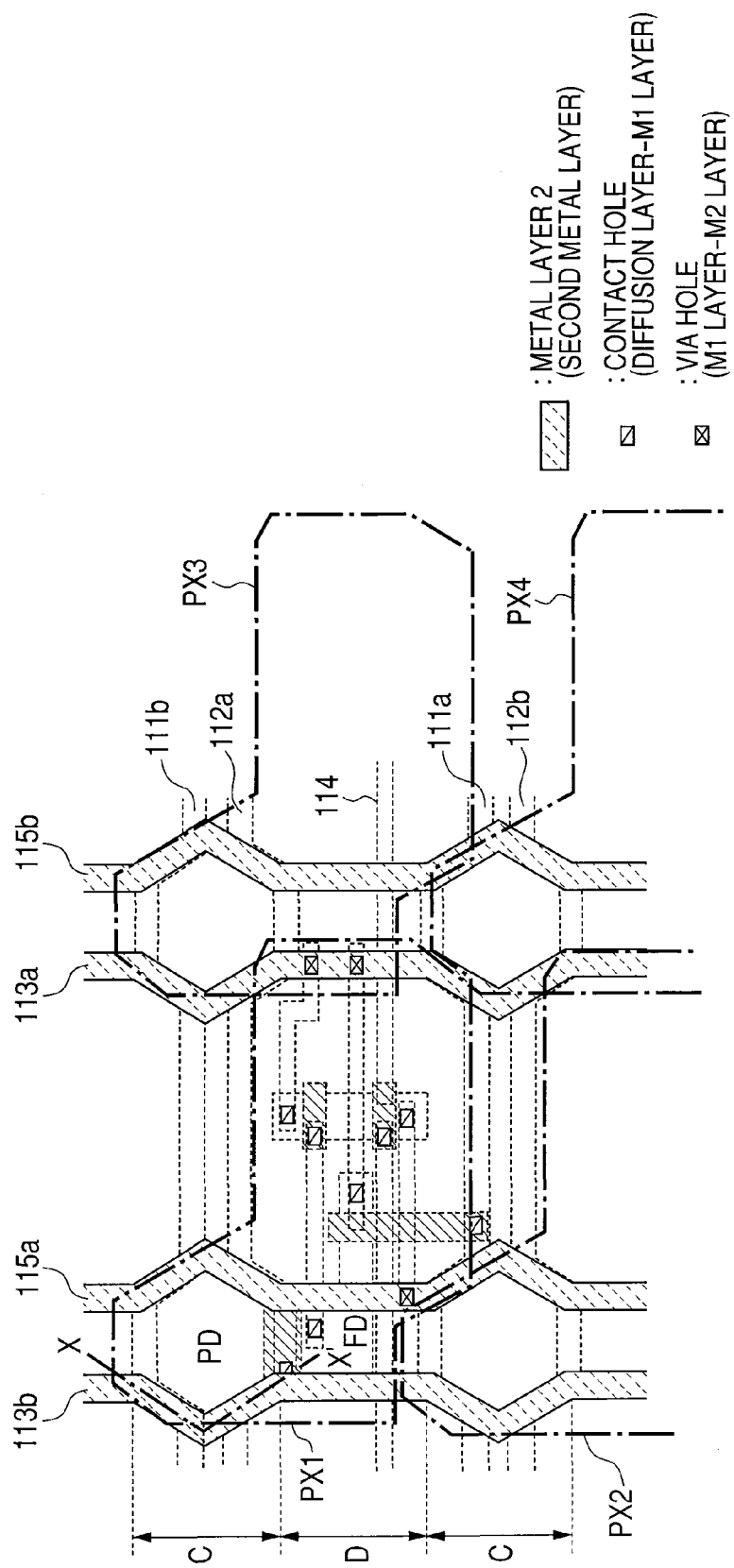
FIG. 6 is a diagram showing a second metal layer layout of the CMOS image sensor (pixel)

Referring to FIG. 6, there is shown an explanatory diagram of a second metal layer (M2 layer) of the CMOS image sensor (pixel). In FIG. 6, the diffusion layer and the first metal layer (M1 layer) are indicated by the dotted lines. A power supply line 113a and a data line 115a are coupled to the pixel PX1. The layout shown in FIG. 6 has the following features: A wiring line laid out about the profile of the light-receiving region of the photodiode PD in the Y direction (each of power supply line 113 and data line 115 in the example demonstrated here) has a bowed portion C bending along the profile of the light-receiving region of the photodiode PD and a straight portion D extending in parallel with a corresponding straight portion of a wiring line adjacent thereto. Further, the portions D of mutually adjacent wiring lines (e.g., power supply line 113b and data line 115a) are disposed to provide a line pitch as narrow as possible. That is, the mutually adjacent wiring lines are disposed with a minimum possible line pitch to the extent that the wiring capacity concerned will not cause an adverse effect on circuit operations.

Figure 1:
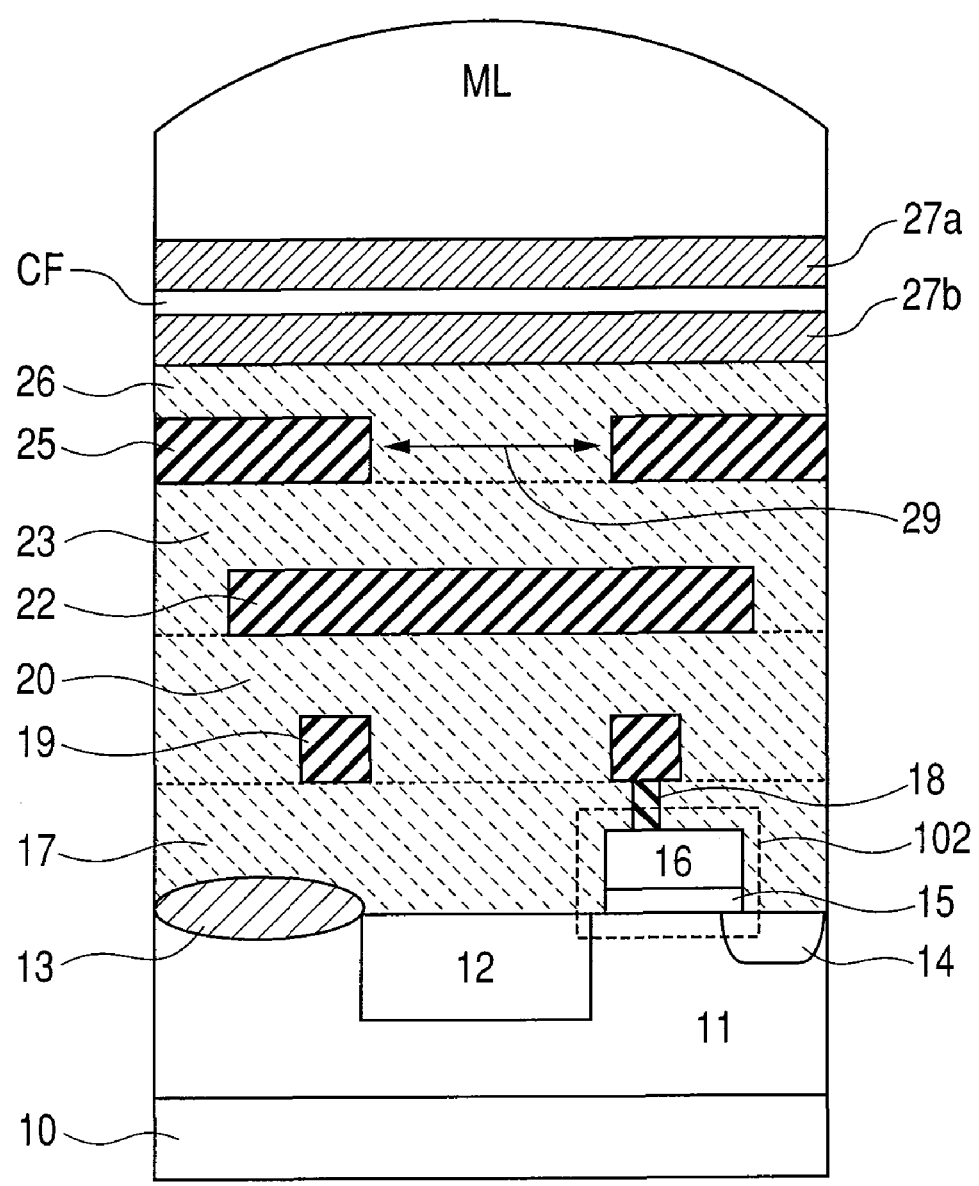
FIG. 1 is a cross-sectional diagram of a CMOS image sensor according to a preferred embodiment of the present invention.

Referring to FIG. 1, there is shown a cross-sectional view of a solid-state image sensor device (CMOS image sensor) according to a preferred embodiment of the present invention. In cases where there is provided a pixel configuration illustrated in FIGS. 2 to 6, the cross-sectional view shown in FIG. 1 corresponds to a view of section taken along line X-X' in FIG. 6. In the example demonstrated here, three metal layers are provided. In a silicon semiconductor substrate 10, a well 11 is formed by impurity doping. Further, the well 11 is doped with an impurity substance having an opposite polarity to form doping regions 12 and 14 therein. The well 11 is of a P type, whereas the doping regions formed therein are of an N type, for example. An doping region 12 is used to provide the photodiode PD, and an doping region 14 is used to provide the floating diffusion node FD, for example. Further, using an doping region 12 for disposing a source electrode and an doping region 14 for disposing a drain electrode, there is formed a MOSFET 102 (transfer MOS transistor) having a gate dielectric 15 and a gate electrode 16. An isolation region 13 is formed of an insulator, which serves to isolate the thus formed MOSFET 102 and the doping region 12 corresponding to the photodiode PD from an adjacent MOSFET. Over the photodiode PD, the floating diffusion node FD, and the MOSFET 102, a first metal layer 19 is formed via a first dielectric layer 17. Over the first metal layer 19, a second metal layer 22 is formed via a second dielectric layer 20, and further a third metal layer 25 is formed via a third dielectric layer 23. A contact hole 18 is formed to provide electrical coupling between each metal layer and an element such as a MOSFET that is formed on the semiconductor substrate 10 or in an active region thereof. A metallic substance such as tungsten (W), for example, is embedded in each contact hole. Although not shown in FIG. 1, a via hole is formed between the metal layers to provide electrical coupling therebetween.

The third metal layer 25, which is the topmost metal layer, serves as a light-shielding film for preventing the incidence of light on other internal regions than the photodiode PD in the example demonstrated here. In the third metal layer 25, an open area 29 is formed at a position just over the photodiode PD. It is to be understood that the third metal layer 25 may also be used to provide a wiring line for electrical signal propagation or a wiring line for applying a reference electric potential. Over the third metal layer 25, a passivation layer 27 is formed via a fourth dielectric layer 26. Further, a microlens ML is formed over the passivation layer 27. In the case of a color imaging type of CMOS image sensor, a color filter CF is sandwiched between a pair of passivation layers 27a and 27b.

Figure 7:
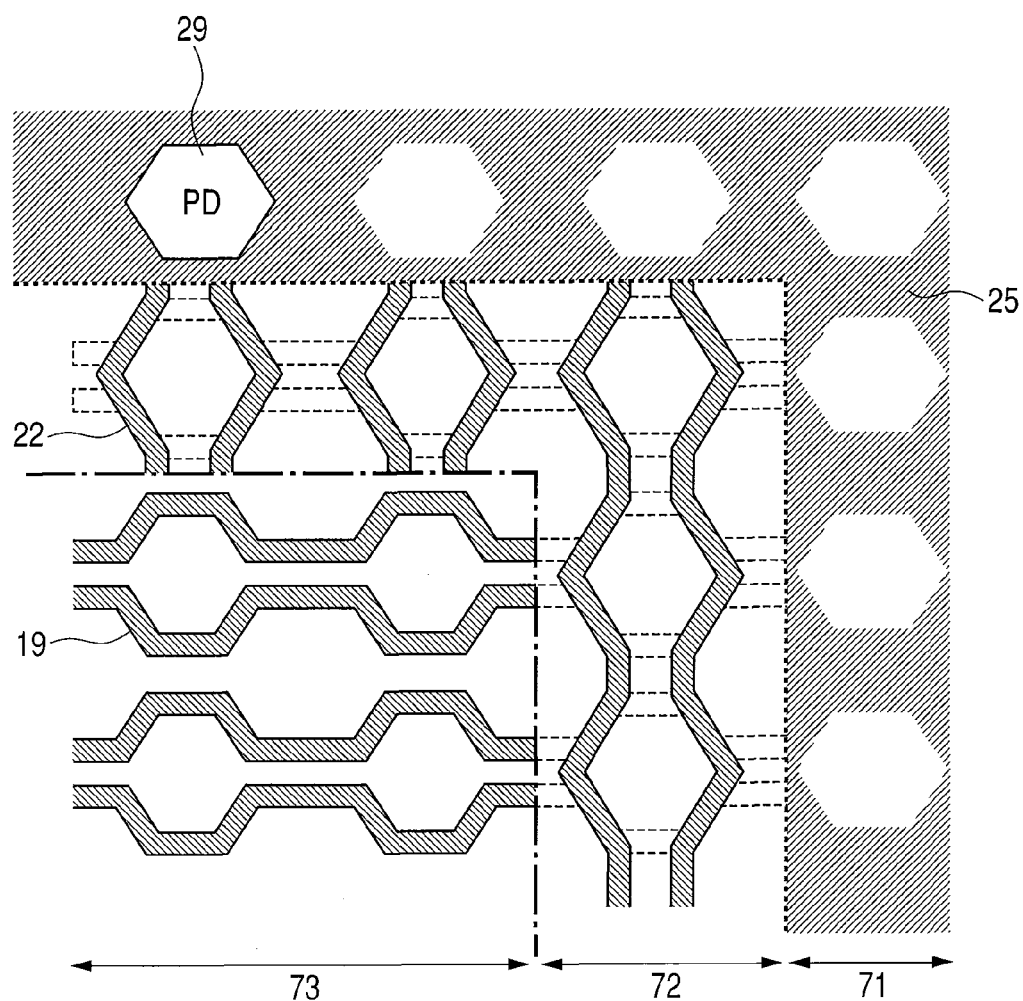
FIG. 7 is a diagram showing a first exemplary wiring line configuration of metal layers and a positional relationship thereof with respect to photodiodes in the CMOS image sensor.

The cross-sectional view of one pixel part is shown in FIG. 1, and in practical applications, a multiplicity of photodiodes PD are arrayed to form a multiplicity of pixels on a semiconductor substrate. Referring to FIG. 7, there is presented a projection view of a partial arrangement including a plurality of photodiodes PD, showing a positional relationship of the photodiodes PD and metal layers. For the sake of easy understanding of a wiring line configuration of each metal layer, the third metal layer 25 is omitted in a partial view inside the dotted lines, and the third metal layer 25 and the second metal layer 22 are omitted in a partial view inside the dot-dash lines. That is, the third metal layer is shown in a partial-view region 71, the second metal layer is shown in a partial-view region 72 (for clarifying a positional relationship with the first metal layer, portions of the first metal layer not overlapping the second metal layer are indicated by the dotted lines), and the first metal layer is shown in a partial-view region 73. Further, in the interest of simplicity in illustration, only the wiring line patterns directly related to the present invention are indicated, and the remaining wiring line patterns and MOSFET gate electrodes are omitted here. It is to be noted that the third metal layer 25 corresponding to the topmost metal layer is provided to serve as a light-shielding film, wherein the open area 29 is formed at a position just over each photodiode PD. The internal regions other than the respective photodiodes PD are thus optically shielded by the third metal layer 25.

As described above, each metal layer included in a pixel part (each of the first to third metal layers in the example demonstrated here) is so configured as to surround the profile of the light-receiving region of each photodiode PD. That is, in a vertical sectional view of one pixel part, a plurality of metallic rings are stacked, one on top of another, at spatial intervals in a fashion that incident light is reflected onto the photodiode PD serving as a light-receiving element of the pixel part. Thus, a kind of metallic cylindrical form having longitudinal discontinuities is configured on the photodiode PD. Although there may occur some light leakage at the longitudinal discontinuities, incident light is reflected by the interior wall of the metallic cylindrical form so as to guidedly impinge on the photodiode PD.

In the structure exemplified in FIG. 7, a metallic ring formed in each of the first and second metal layers is provided with an open area, which electrically separates two wiring lines from each other to allow higher efficiency in terms of wiring arrangement. Although crosswise discontinuities corresponding to the open areas may cause some leakage of incident light, the degree of leakage can be minimized by reducing the space of each of these crosswise discontinuities.

Figure 8:
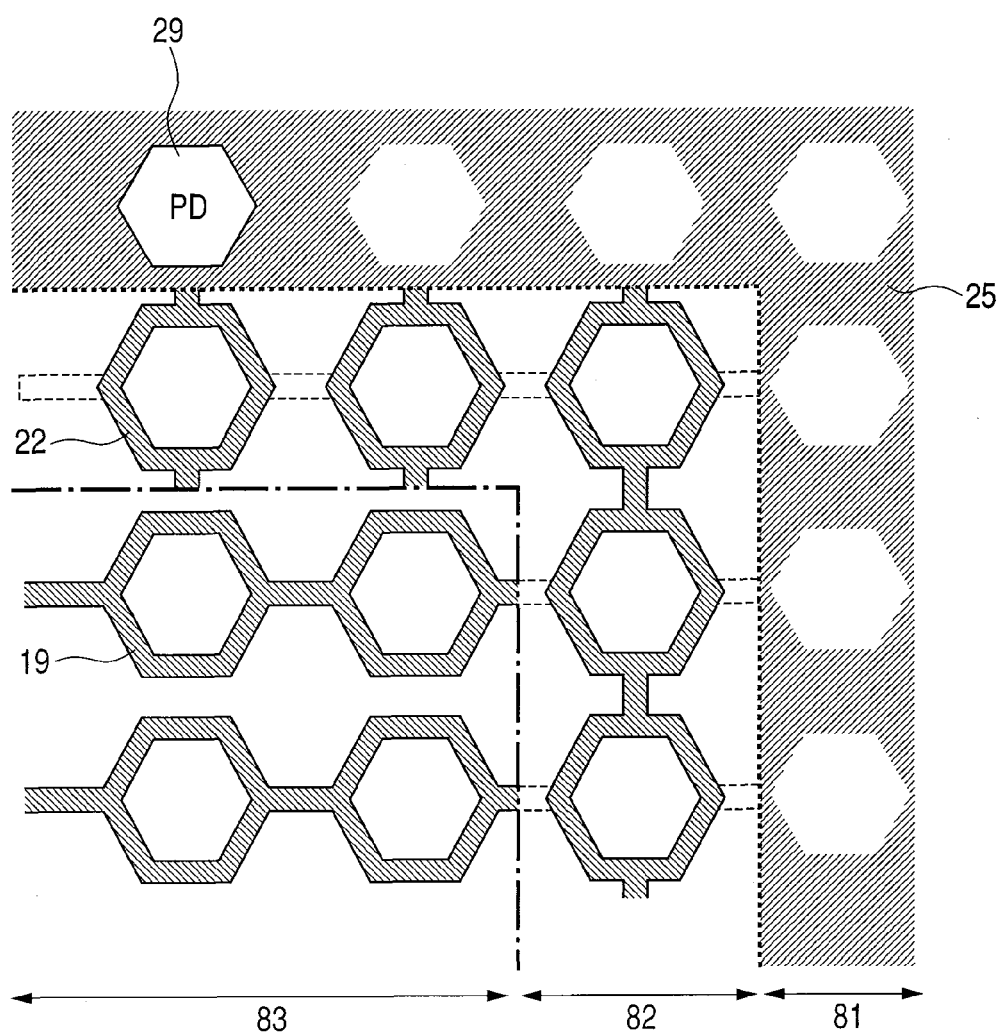
FIG. 8 is a diagram showing a second exemplary wiring line configuration of metal layers and a positional relationship thereof with respect to photodiodes in the CMOS image sensor.

Referring to FIG. 8, there is presented a projection view of another wiring line configuration wherein a complete metallic ring having no open area is formed in each of the first and second metal layers. Similarly to the case exemplified in FIG. 7, the third metal layer is shown in a partial-view region 81, the second metal layer is shown in a partial-view region 82 (for clarifying a positional relationship with the first metal layer, portions of the first metal layer not overlapping the second metal layer are indicated by the dotted lines), and the first metal layer is shown in a partial-view region 83. In the wiring line configuration exemplified in FIG. 8, a plurality of wiring lines used for propagation of different signals shown in FIG. 5, e.g., the reset line 111 and the transfer line 112 extending in the X direction, are unified into a single-line form. In this case of wiring line configuration, either one of the wiring lines is laid out as a separate wiring line, e.g., a select line 114, disposed between mutually adjacent ring-formed wiring lines for practical implementation.

As described above, in the arrangement of the metal layers for configuring pixel parts according to the preferred embodiments of the present invention, a plurality of metallic rings are formed in the respective metal layers by surrounding the profile of the light-receiving region of each photodiode PD with wiring lines. The metallic rings thus formed of wiring lines can be functionally used as an optical waveguide for collecting light onto the light-receiving region of each photodiode PD. The optical waveguide configured as mentioned above has a metallic cylindrical form with a plurality of discontinuities in the longitudinal direction (in FIGS. 7 and 8) and/or in the crosswise direction (in FIG. 7). Although there may occur some light leakage at the discontinuities, incident light is reflected by the interior wall of the metallic cylindrical form so as to guidedly impinge on the photodiode PD. Thus, according to the preferred embodiments of the present invention, a structural form substantially similar to a metallic cylinder is provided by using wiring lines. Since the formation of the wiring lines is included in processes necessary for fabricating a solid-state image sensor device, it is just required to modify wiring arrangements currently adopted in practice for carrying out the present invention.

Described below are possible effects of the above-mentioned discontinuities on the efficiency of light incidence. From the point of view of application purposes of a solid-state image sensor device, it is of key importance to enhance the efficiency of collection of visible light (wavelength: approximately 380 nm to 750 nm). Regarding the efficiency of light incidence, the present inventors have conducted simulation experiments as follows: On a structural arrangement comprising a microlens disposed over a photodiode via an dielectric layer and a passivation layer, a visible light beam having a wavelength of 500 nm was applied perpendicularly to measure what percent of light incident on the microlens reached the photodiode. Under a condition where metallic rings were disposed at a longitudinal pitch (interval) of zero, i.e., a complete metallic cylindrical form was disposed, the efficiency value of light incidence was approximately 75%. With respect to this reference, measurements and calculations were made on configurations having different longitudinal pitches in each dielectric layer between metallic rings, resulting in the following data being obtained. The efficiency values of light incidence were approximately 67% at a longitudinal pitch of 500 nm that is equal to the wavelength of the incident light, approximately 69% at a longitudinal pitch of 250 nm (½ the wavelength of the incident light), approximately 72% at a longitudinal pitch of 125 nm (¼ the wavelength of the incident light), and 74% at a longitudinal pitch of 80 nm. As indicated by these data, a narrower longitudinal pitch, i.e., a narrower longitudinal discontinuity value is preferable in terms of the efficiency of light incidence. In practical applications, a significant decrease in the efficiency of light incidence can be suppressed by restricting the thickness of each dielectric layer to approximately ½ the wavelength of the incident light. Regarding the crosswise discontinuities, since each value thereof is restricted to approximately 200 nm in practical applications, no significant adverse effect is given to the efficiency of light incidence.

Figure 9:
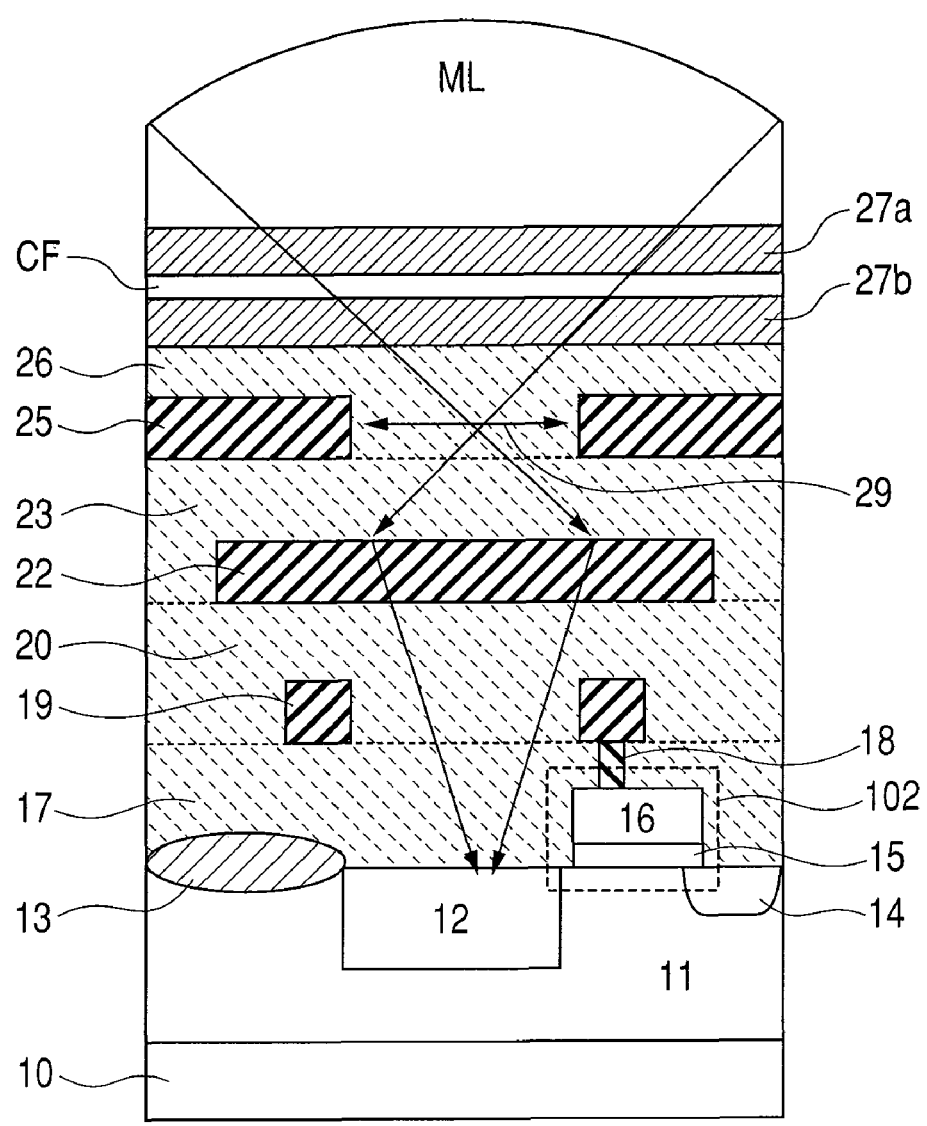
FIG. 9 is a ray diagram showing an incident light path.

As shown in FIG. 1, the passivation layer 27 is formed over the third metal layer 25 via the fourth dielectric layer 26, and further the microlens ML is formed over the passivation layer 27. It is allowed to set up a proper focus position of the microlens ML by adjusting the film thickness of the passivation layer 27 (the sum of the film thicknesses of the passivation layer 27 and the color filter CF in cases where the color filter CF is provided) and the radius of curvature of the microlens ML. For enhancement of the advantageous effect of the present invention, it is preferable to adjust the focus position to the open area 29 of the light-shielding film, i.e., to the vicinity of the topmost metal layer. Referring to FIG. 9, there is shown an incident light path in a case where the focus position is set up at the open area 29. Under this condition, most of incident light is introduced inward through the open area 29, and then reflected by the interior wall of the layered metallic ring so as to impinge on the photodiode PD indicated by reference numeral 12. As demonstrated in FIG. 9, the efficiency of light collection can be enhanced by setting up the focus position at the open area 29 or the vicinity thereof.

It is to be noted that the metallic ring layered over the photodiode PD is not necessarily required to serve as a wiring line. That is, there may be provided such an arrangement that a metallic material entirely surrounded by an dielectric layer is embedded merely for the purpose of serving as a member of an optical waveguide, without any electrical connection to the semiconductor substrate and other wiring lines. Since the formation of such a metallic material can be made in the same process step for forming other surrounding wiring patterns, there is no need to take account of such factors as additional production cost in implementation of the above arrangement.

Figure 10:
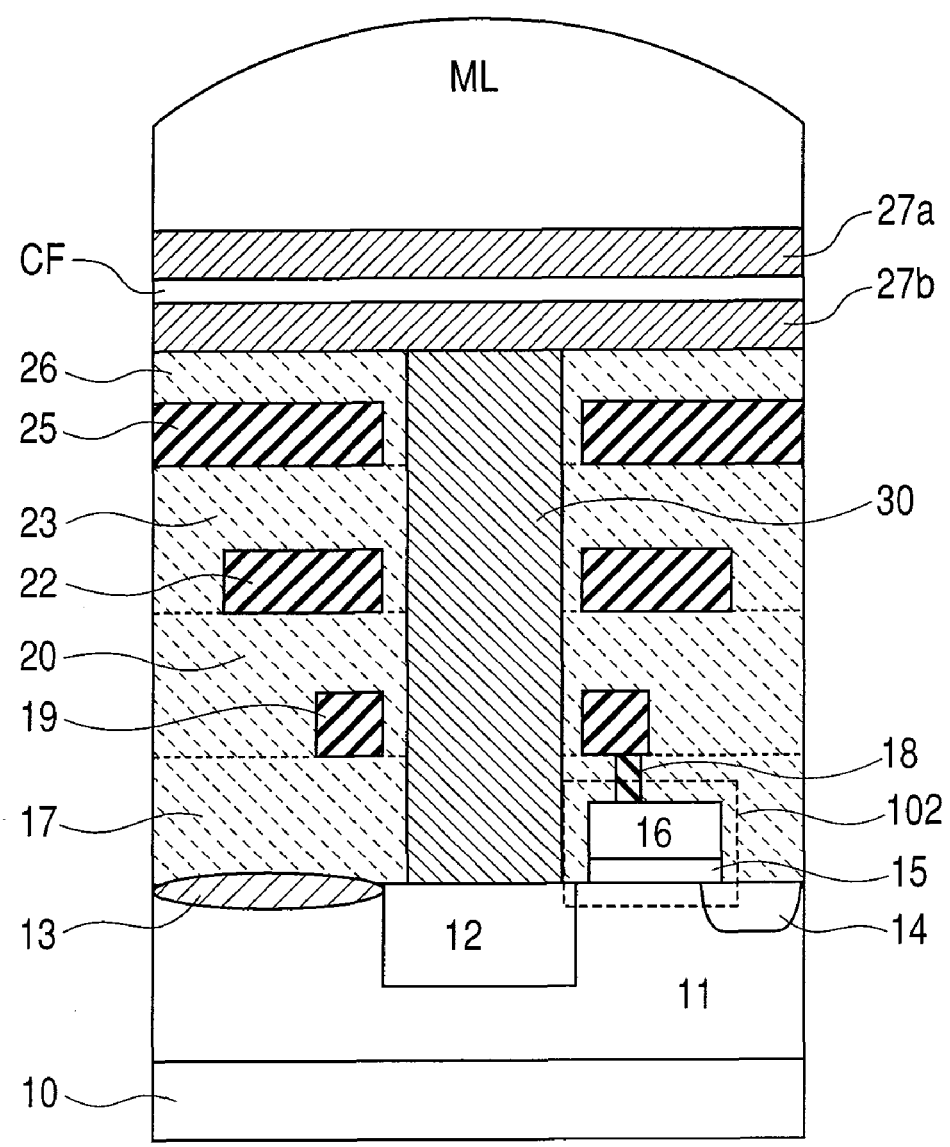
FIG. 10 is a cross-sectional diagram of a CMOS image sensor according to another preferred embodiment of the present invention.

Further, in combination of the present invention with a conventional optical waveguide, it is possible to provide the advantageous effect of suppressing crosstalk due to incident light leakage. For example, there may be provided an arrangement wherein a high-refractive-index material is embedded inside the layered metallic rings to form an optical waveguide, as shown in FIG. 10 which is a cross-sectional view of a pixel part taken across the center of the light-receiving region. In the structural configuration shown in FIG. 10, there is provided an optical waveguide 30. It is common practice to use polyimide resin or the like as a high-refractive-index material for embedment in an optical waveguide. Since the surrounding dielectric layer, i.e., a silicon oxide film, has a refractive index of approximately 1.46, it is required to use a material having a higher refractive index, e.g., a reflective index of approximately 1.6 to 1.8. Further, there may also be provided a modified arrangement in which the interior wall of an optical waveguide is covered with a high-refractive-index covering material. For example, silicon nitride commonly used in semiconductor device fabrication processes has a relatively high refractive index of approximately 2.0. Hence, on the interior wall of a hole defined for use as an optical waveguide, silicon nitride may be deposited by chemical vapor deposition (CVD) or the like. Still further, the above-mentioned two techniques for optical waveguide formation may be used in combination in the following manner: The interior wall of an optical waveguide is covered with a high-refractive-index covering material, and then a material having a refractive index lower than that of the covering material is embedded inside the optical waveguide having the internal wall thus covered.

High-refractive-index materials applicable as embedding materials for optical waveguides are expensive in general terms, and hence, materials having a relatively low refractive index are used in practice of conventional optical waveguide formation. Consequently, it is rather difficult to form an optical waveguide capable of completely confining light therein in the conventional practical applications, giving rise to the problem of crosstalk due to light leakage from an optical waveguide to adjacent pixels. Even in the use of such a conventional optical waveguide that there may occur some light leakage, it is possible to effectively suppress crosstalk due to light leakage by forming a layered structure of metallic rings around the optical waveguide according to the preferred embodiments of the present invention.

While the present invention has been described in detail with respect to applications to CMOS image sensors, it is to be understood that the present invention is not limited thereto and may be applied to other types of solid-state image sensor devices such as a CCD image sensor, for example.

What is claimed is:

1. A solid-state image sensor device, comprising:
   a photodiode;
   first and second wiring lines disposed at mutually adjacent positions in a first metal layer, each of the first and second wiring lines being arranged to extend in a first direction and to have a bowed portion bending along a profile of a light-receiving region of the photodiode;
   third and fourth wiring lines disposed at mutually adjacent positions in a second metal layer, each of the third and fourth wiring lines being arranged to extend in a second direction different from the first direction and to have a bowed portion bending along the profile of the light-receiving region of the photodiode; and
   a microlens;
   wherein the bowed portions of the first and second wiring lines are configured to surround the profile of the light-receiving region of the photodiode in the form of a ring,
   wherein the bowed portions of the third and fourth wiring lines are configured to surround the profile of the light-receiving region of the photodiode in the form of a ring, and
   wherein light collected through the microlens is introduced to the light-receiving region of the photodiode by passage through the inside of the ring formed by the bowed portions of the first and second wiring lines and the inside of the ring formed by the bowed portions of the third and fourth wiring lines.

2. The solid-state image sensor device according to claim 1,
   wherein a light-shielding film having an open area thereof at a position corresponding to the light-receiving region of the photodiode is formed in a third metal layer disposed over the second metal layer, and
   wherein the microlens has a focus position thereof at the open area of the light-shielding film.

3. The solid-state image sensor device according to claim 1,
   wherein there is provided an optical waveguide that is configured through the inside of the ring formed by the bowed portions of the first and second wiring lines and through the inside of the ring formed by the bowed portions of the third and fourth wiring lines, the optical waveguide being arranged to reach the light-receiving region of the photodiode.

4. The solid-state image sensor device according to claim 3,
   wherein a material used for forming the optical waveguide has a refractive index higher than that of silicon oxide.

5. The solid-state image sensor device according to claim 1,
   wherein there is provided a hole that is configured through the inside of the ring formed by the bowed portions of the first and second wiring lines and through the inside of the ring formed by the bowed portions of the third and fourth wiring lines, the hole being arranged to reach the light-receiving region of the photodiode, and
   wherein an interior wall of the hole is covered with a first material having a refractive index higher than that of silicon oxide.

6. The solid-state image sensor device according to claim 5,
   wherein a second material having a refractive index lower than that of the first material is embedded inside the hole.

7. A solid-state image sensor device, comprising:
   a photodiode;
   a first wiring line disposed in a first metal layer, the first wiring line being arranged to extend in a first direction and to have a ring-formed portion with an open area thereof at a position corresponding to a light-receiving region of the photodiode;
   a second wiring line disposed in a second metal layer, the second wiring line being arranged to extend in a second direction different from the first direction and to have a ring-formed portion with an open area thereof at a position corresponding to the light-receiving region of the photodiode; and
   a microlens;
   wherein light collected through the microlens is introduced to the light-receiving region of the photodiode by passage through the open area of the ring-formed portion of the first wiring line and the open area of the ring-formed portion of the second wiring line.

8. The solid-state image sensor device according to claim 7,
   wherein a light-shielding film having an open area thereof at a position corresponding to the light-receiving region of the photodiode is formed in a third metal layer disposed over the second metal layer, and
   wherein the microlens has a focus position thereof at the open area of the light-shielding film.

9. The solid-state image sensor device according to claim 7,
   wherein there is provided an optical waveguide that is configured through the open area of the ring-formed portion of the first wiring line and through the open area of the ring-formed portion of the second wiring line, the optical waveguide being arranged to reach the light-receiving region of the photodiode.

10. The solid-state image sensor device according to claim 9,
    wherein a material used for forming the optical waveguide has a refractive index higher than that of silicon oxide.

11. The solid-state image sensor device according to claim 7,
    wherein there is provided a hole that is configured through the open area of the ring-formed portion of the first wiling line and through the open area of the ring-formed portion of the second wiring line, the hold being arranged to reach the light-receiving region of the photodiode, and
    wherein an interior wall of the hole is covered with a first material having a refractive index higher than that of silicon oxide.

12. The solid-state image sensor device according to claim 11,
    wherein a second material having a refractive index lower than that of the first material is embedded inside the hole.

* * * * *